(12) United States Patent
Wang et al.

(10) Patent No.: US 11,201,088 B2
(45) Date of Patent: Dec. 14, 2021

(54) SEMICONDUCTOR DEVICE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Hu Wang, Shanghai (CN); Shan Shan Wang, Shanghai (CN); Feng Qiu, Shanghai (CN); Wei Hu Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/930,878

(22) Filed: Jul. 16, 2020

(65) Prior Publication Data
US 2021/0020519 A1   Jan. 21, 2021

(30) Foreign Application Priority Data

Jul. 17, 2019   (CN) .......................... 201910645338.5

(51) Int. Cl.
*H01L 29/66* (2006.01)
*H01L 29/78* (2006.01)
(Continued)

(52) U.S. Cl.
CPC ............... *H01L 21/823462* (2013.01); *H01L 21/02271* (2013.01); *H01L 21/31111* (2013.01);
(Continued)

(58) Field of Classification Search
CPC ......... H01L 21/823462; H01L 29/7816; H01L 29/1095; H01L 29/42368; H01L 29/66681; H01L 21/02271; H01L 27/088; H01L 21/31116; H01L 21/32135; H01L 21/823425; H01L 21/823437; H01L 21/31111; H01L 29/66659; H01L 29/7835; H01L 21/823857; H01L 21/28008; H01L 21/28158; H01L 27/0922
See application file for complete search history.

(56) References Cited

U.S. PATENT DOCUMENTS 8,546,213 B2 *  10/2013  Miyoshi .............. H01L 27/0629
                                                             438/237

* cited by examiner

*Primary Examiner* — David Vu
(74) *Attorney, Agent, or Firm* — Anova Law Group, PLLC (57) ABSTRACT

A method for forming a semiconductor device includes providing a substrate, forming an oxide layer over the substrate, forming a plurality of first gate oxide layers by etching the oxide layer, forming a second gate oxide layer between adjacent first gate oxide layers, forming a silicon layer over the plurality of first gate oxide layers and the second gate oxide layer, and etching the plurality of first gate oxide layers, the silicon layer, and the second gate oxide layer to expose the substrate, thereby forming a plurality of gate structures. The first gate oxide layer of the plurality of first gate oxide layers has sloped sidewalls. A thickness of the second gate oxide layer is less than a thickness of the first gate oxide layer. Each gate structure includes an etched first oxide layer, a portion of the second gate oxide layer, and a portion of the silicon layer.

13 Claims, 4 Drawing Sheets

(51) Int. Cl.
  *H01L 29/10* (2006.01)
  *H01L 21/8234* (2006.01)
  *H01L 29/423* (2006.01)
  *H01L 21/02* (2006.01)
  *H01L 27/088* (2006.01)
  *H01L 21/311* (2006.01)
  *H01L 21/3213* (2006.01)
(52) U.S. Cl.
  CPC .. *H01L 21/31116* (2013.01); *H01L 21/32135* (2013.01); *H01L 21/823425* (2013.01); *H01L 21/823437* (2013.01); *H01L 27/088* (2013.01); *H01L 29/1095* (2013.01); *H01L 29/42368* (2013.01); *H01L 29/66681* (2013.01); *H01L 29/7816* (2013.01)

SEMICONDUCTOR DEVICE AND METHOD FOR FORMING THE SAME

CROSS-REFERENCE TO RELATED APPLICATION

This application claims priority to Chinese Patent Application No. 201910645338.5, filed on Jul. 17, 2019, the entire content of which is incorporated herein by reference.

TECHNICAL FIELD

The present disclosure relates to the field of semiconductor manufacturing technology and, more particularly, to a semiconductor device and a method for forming the same.

BACKGROUND

With development of semiconductor technology, power integrated circuits (PIC) have been used in many fields. A laterally double-diffused metal oxide semiconductor (LDMOS) may provide characteristics of high working voltage, simple process, and easy process compatibility with complementary metal-oxide semiconductors (CMOS). LDMOS is thus widely used as a power device in PIC.

Drain-source breakdown voltage (BVdss) and turn-on resistance (Ron) characteristics of power devices are important for high efficiency power circuit design. LDMOS devices require higher BVdss and lower Ron for better device performance. However, Ron and BVdss of the LDMOS devices are contradictory indicators. If Ron decreases, BVdss may also decrease, and vice versa.

Therefore, there is a need to provide a semiconductor structure and method for forming the same with lowest Ron to reduce conduction loss at certain BVdss.

SUMMARY

To address existing problems, embodiments and implementations of the present disclosure provide a semiconductor device and a formation method thereof, so as to provide a semiconductor device with higher drain-source breakdown voltage (BVdss) and lower turn-on resistance (Ron).

One aspect of the present disclosure provides a method for forming a semiconductor device. In the method, a substrate is provided. An oxide layer is formed over the substrate. A plurality of first gate oxide layers by etching the oxide layer, wherein the first gate oxide layer of the plurality of first gate oxide layers has sloped sidewalls. A second gate oxide layer is formed between adjacent first gate oxide layers, where a thickness of the second gate oxide layer is less than a thickness of the first gate oxide layer. A silicon layer is formed over the plurality of first gate oxide layers and the second gate oxide layer. The plurality of first gate oxide layers, the silicon layer, and the second gate oxide layer are etched to expose the substrate, thereby forming a plurality of gate structures. Each gate structure includes an etched first oxide layer, a portion of the second gate oxide layer, and a portion of the silicon layer formed on the etched first oxide layer and the portion of the second gate oxide layer.

Optionally, forming the plurality of first gate oxide layers includes etching the oxide layer using a dry etching process, such that a remaining oxide layer includes initial first gate oxide layers each with sloped sidewalls and an oxide layer portion between adjacent initial first gate oxide layers and having a thickness based on the substrate, and removing the oxide layer portion of the remaining oxide layer from the substrate using a wet etching process to form the plurality of first gate oxide layers.

Optionally, an etching gas of the dry etching includes octafluorocyclobutane ($C_4F_8$), carbon tetrafluoride ($CF_4$), and fluoroform ($CHF_3$), having a volume ratio of 2:1:3, correspondingly.

Optionally, an angle made between a sloped sidewall of the first gate oxide layer and the substrate is 30° to 60°.

Optionally, forming the oxide layer includes a chemical vapor deposition (CVD) method.

Optionally, etching the plurality of first gate oxide layers, the silicon layer, and the second gate oxide layer includes etching the plurality of first gate oxide layers. Etching the plurality of first gate oxide layers includes dry-etching one of the sloped sidewalls of each first gate oxide layer to form a vertical sidewall on a portion of the dry-etched first gate oxide layer over the substrate, where the portion of the dry-etched first gate oxide layer has a thickness over the substrate, and wet-etching to remove the portion of the dry-etched first gate oxide layer having the thickness from the substrate, where another sloped sidewall of the sloped sidewalls of each first gate oxide layer remains over the substrate.

Optionally, an etching gas used in the dry-etching includes carbon tetrafluoride ($CF_4$) and fluoroform ($CHF_3$).

Optionally, an etching solution used in the wet-etching includes an HF solution.

Optionally, etching the plurality of first gate oxide layers, the silicon layer, and the second gate oxide layer includes etching the silicon layer and the second gate oxide layer. Etching the silicon layer and the second gate oxide layer includes etching the silicon layer to expose the second gate oxide layer by using a dry etching process, and etching the second gate oxide layer to expose the substrate by using a dry etching process.

Optionally, an etching gas used in the dry etching of the silicon layer includes hydrogen bromide (HBr) and chlorine gas ($Cl_2$).

Optionally, an etching gas used in the dry etching of the second gate oxide layer includes hydrogen bromide (HBr) and Helium gas (He).

Optionally, the etched first gate oxide layer in each gate structure has a sloped sidewall on one side and a vertical sidewall on another side.

Optionally, after forming the plurality of gate structures, the method further includes forming a source region and a drain region in the substrate on both sides of each gate structure. The source region is formed adjacent to one of the sloped sidewalls of the first gate oxide layer. The drain region is formed adjacent to the vertical sidewall of the etched first gate oxide layer.

Another aspect of the present disclosure provides a semiconductor device, including a substrate and a gate structure. The gate structure is located over the substrate, the gate structure including a first gate oxide layer, a second gate oxide layer, and a silicon layer. The first gate oxide layer is over the substrate, and the first gate oxide layer has a sloped sidewall on one side and a vertical sidewall on another side. The second gate oxide layer is over the substrate and on the sloped sidewall of the first gate oxide layer, and a thickness of the second gate oxide layer is less than a thickness of the first gate oxide layer. The silicon layer is formed over the first gate oxide layer and the second gate oxide layer.

Optionally, the semiconductor device further includes a source region and a drain region. The source region and the drain region are formed in the substrate on both sides of the gate structure. The source region is formed adjacent to the sloped sidewall of the first gate oxide layer. The drain region is formed adjacent to the vertical sidewall of the first gate oxide layer.

Optionally, the semiconductor device further includes a drift region in the substrate, where the drift region is under the vertical sidewall of the first gate oxide layer.

Optionally, an angle between the sloped sidewall of the first gate oxide layer and the substrate is 30° to 60°.

Compared to the existing technology, the technical solution of the present disclosure at least includes the following advantages.

The first gate oxide layer includes the sloped sidewall. The thickness of the sidewall of the first gate oxide layer gradually decreases in a direction from the middle of the first gate oxide layer toward the sidewall. The thickness of the second gate oxide layer is less than the thickness of the first gate oxide layer. The first gate oxide layer and the second gate oxide layer combine to form the step-shaped gate oxide layer with variation in the thickness. If only the first gate oxide layer is used, a requirement of the voltage resistance may be achieved. However, during the subsequent operation of the semiconductor device, when the inversion layer is formed, the capacitance is small for a too thick gate oxide layer. As such, the device is relatively difficult to be turned on, and the response speed is slow. If only the second gate oxide layer is used, the requirement of the voltage resistance may not be achieved since the thickness of the gate oxide layer is not enough. By using the combined first gate oxide layer and the second gate oxide layer, BVdss can be increased, and Ron can be decreased.

Further, the source region and drain region are formed. The source region is adjacent to the sloped sidewall of the first gate oxide layer. The drain region is adjacent to the vertical sidewall of the first gate oxide layer. During the subsequent operation of the semiconductor device, the electric field is the largest near the drain region and gradually decreases from the drain region to the source region. Therefore, the thickness of the gate oxide layer does not need to be too thick near the source region. The thickness is reduced through the sloped sidewall of the first gate oxide layer and the second gate oxide layer. During the subsequent operation of the semiconductor device, when the inversion layer is formed over the substrate under the sloped region of the first gate oxide layer and the second gate oxide layer, the device is easier to be turned on, and the response speed is improved due to reduction of the thickness of the gate oxide layer.

Other aspects of the present disclosure can be understood by those skilled in the art in light of the description, the claims, and the drawings of the present disclosure.

BRIEF DESCRIPTION OF THE DRAWING

The following drawings are merely examples for illustrative purposes according to various disclosed embodiments and are not intended to limit the scope of the present disclosure.

DETAILED DESCRIPTION

In a laterally double-diffused metal oxide semiconductor (LDMOS) device, a field oxide layer is formed in the LDMOS device to increase the drain-source breakdown voltage (BVdss). The field oxide layer is usually formed by local oxidation of silicon. For example, a thermal oxidation treatment may be performed on silicon to form an oxide layer by using a nitride as a mask layer. Since the oxide layer is thicker than consumed silicon, oxidative growth under the nitride mask raises an edge of the nitride, which generates "bird's beak effect," forms a drainage channel, and is harmful to pressure resistance of a semiconductor device. If the BVdss is increased by increasing a thickness of a gate oxide layer, the turn-on resistance (Ron) of the device is increased, and response speed is slowed down.

The present disclosure provides a semiconductor device and a method for forming the semiconductor device. For example, the method includes forming an oxide layer over a semiconductor substrate, and forming a plurality of first gate oxide layer by etching the oxide layer. The first gate oxide layer of the plurality of first gate oxide layers has sloped sidewalls. The method further includes forming a second gate oxide layer between adjacent first gate oxide layers. The thickness of the second gate oxide layer is less than the thickness of the first gate oxide layer. The thickness of one of the sidewalls of the first gate oxide layer gradually decreases in a direction from the middle of the first gate oxide layer toward the sidewall due to the slope of the sidewall. The first gate oxide layer is combined with the second gate oxide layer to form a step-shaped gate oxide layer.

In an aspect, instead of growing the oxide layer by consuming the silicon, the oxide layer is directly formed over the substrate to avoid the "bird's beak effect." In another aspect, a voltage value gradually decreases in a direction from a sloped corner of the first gate oxide layer to the sidewall of the first gate oxide layer during subsequent operation of the semiconductor device. Therefore, the thickness of the first gate oxide layer is thicker from the middle of the first gate oxide layer to the sloped corner, such that the semiconductor device is not easy to be broken down, and BVdss of the semiconductor device may be increased. The gate oxide layer does not need to be too thick where a voltage value is small. Therefore, the thickness of the gate oxide layer is reduced in a direction from the middle of the first gate oxide layer to the sidewall and toward the second gate oxide layer, which may allow the device to maintain a low Ron.

To make the above-described objectives, features, and beneficial effects of the present disclosure more clear, specific embodiments of the present disclosure are described in detail below in connection with the accompanying drawings.

Figure 8:
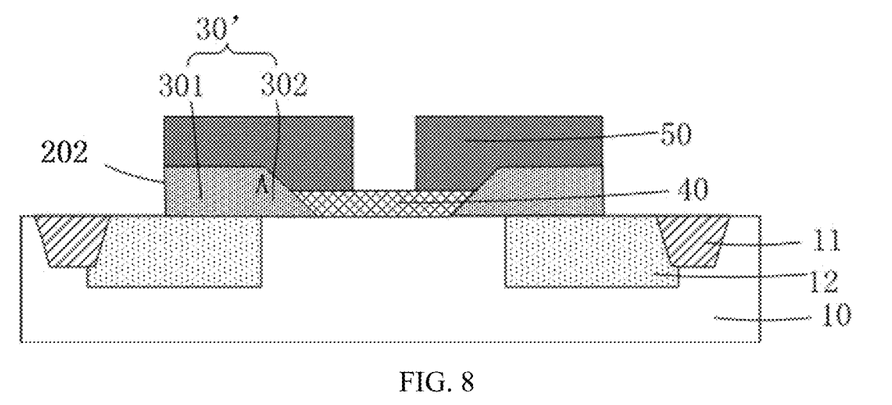
Figure 9:
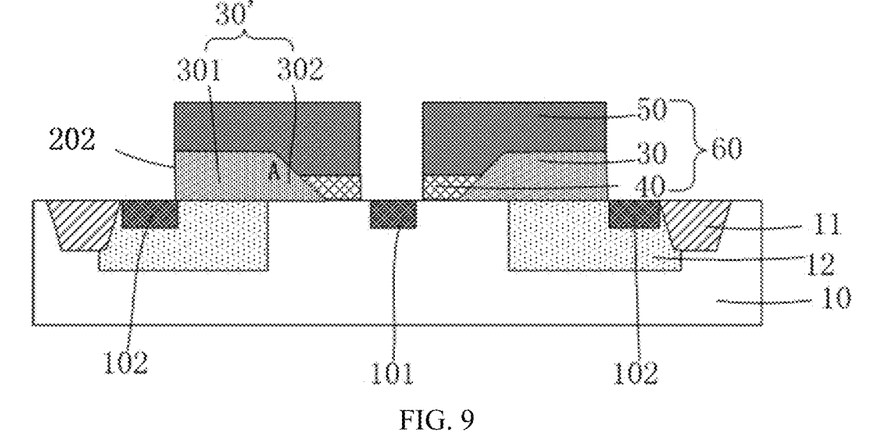
Figure 10:
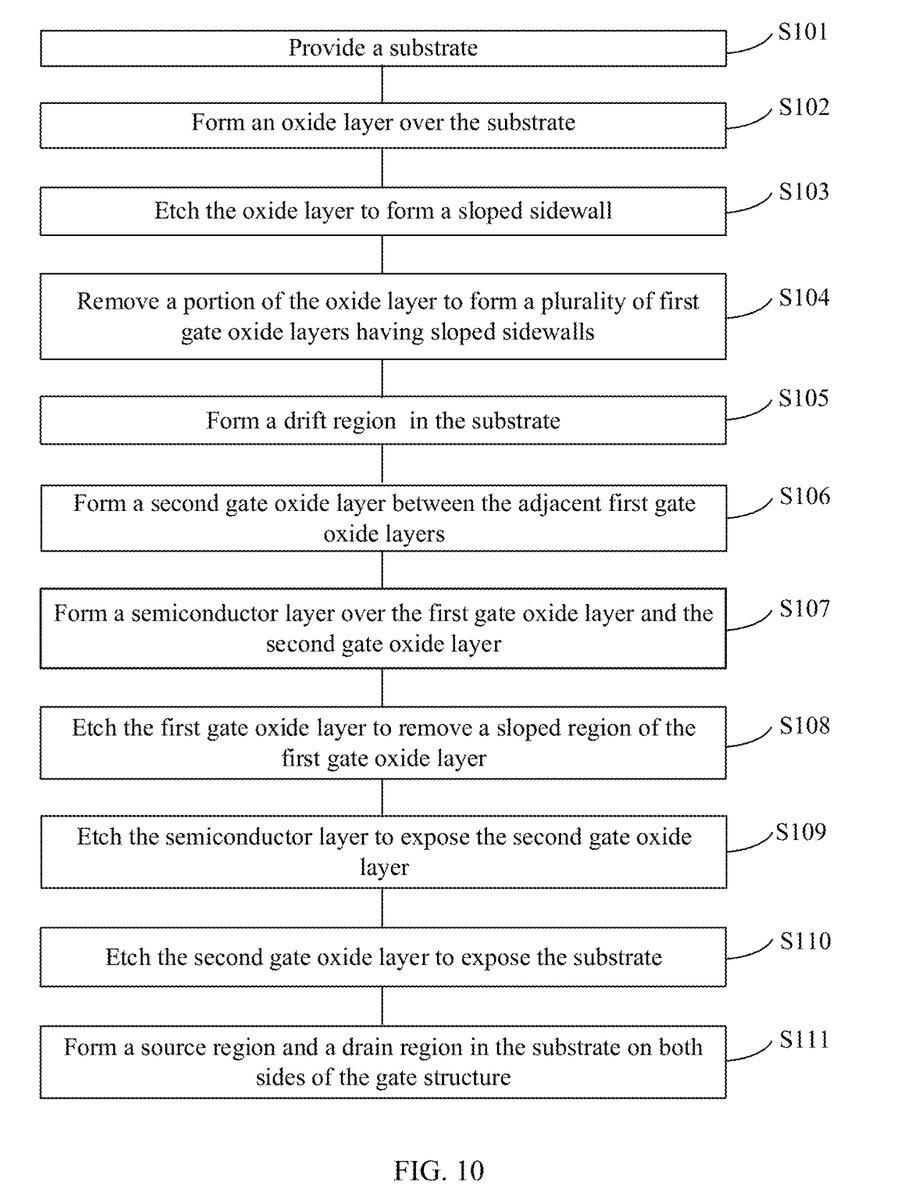
FIG. 10 illustrates a flowchart of an exemplary method for forming a semiconductor device according to some embodiments of the present disclosure.

FIG. 1 to FIG. 9 illustrate schematic diagrams of cross-sectional structures at certain stages during a process of forming an exemplary semiconductor device according to some embodiments of the present disclosure. FIG. 10 illustrates a flowchart of an exemplary method for forming a semiconductor device according to some embodiments of the present disclosure.

Figure 1:
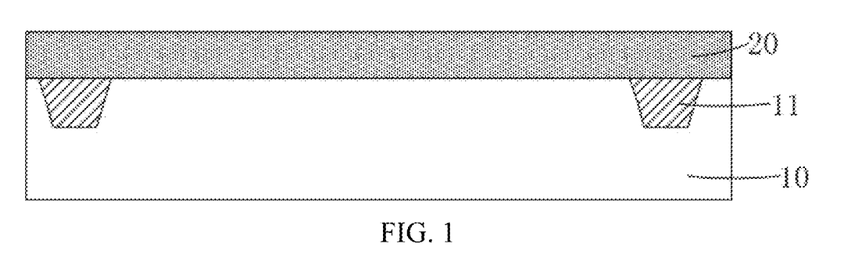
FIG. 1 to FIG. 9 illustrate schematic diagrams of cross-sectional structures at certain stages during a process of forming an exemplary semiconductor device according to some embodiments of the present disclosure.

As shown in FIG. 10, in S101, a substrate is provided. FIG. 1 illustrates a corresponding structure.

As shown in FIG. 1, a substrate 10 is provided.

In some embodiments, the substrate 10 includes a silicon substrate. In other embodiments, a material of the substrate 10 may include at least one of germanium (Ge), silicon germanium (SiGe), silicon carbide (SiC), silicon on insulator (SOI), stacked silicon on insulator (SSOI), silicon germanium on insulator (SiGeOI), germanium on insulator (GeOI), etc.

A process of providing the substrate 10 further includes forming a shallow trench isolation structure 11 in the substrate 10.

Returning to FIG. 10, in S102, an oxide layer is formed over the substrate. FIG. 1 illustrates a corresponding structure. As shown in FIG. 1, an oxide layer 20 is formed over the substrate 10. In one embodiment, a material of the oxide layer 20 includes silicon oxide.

In some embodiments, forming the oxide layer 20 includes a chemical vapor deposition (CVD) method. Process parameters of the CVD method include a reaction gas of tetraethylene orthosilicate (TEOS), a reaction pressure of 0.3 Torr-0.5 Torr, and a reaction temperature of 600° C.-700° C.

The CVD method is used to deposit the oxide layer 20 directly over the substrate 10 instead of forming the oxide layer 20 by consuming the substrate 10, which can avoid the "bird's beak effect" and improve the voltage resistance of semiconductor devices.

After the oxide layer 20 is formed, the oxide layer 20 is densified by high-temperature thermal treatment. Densification may improve the quality of the oxide layer 20 and benefit performing of subsequent processes.

Figure 2:
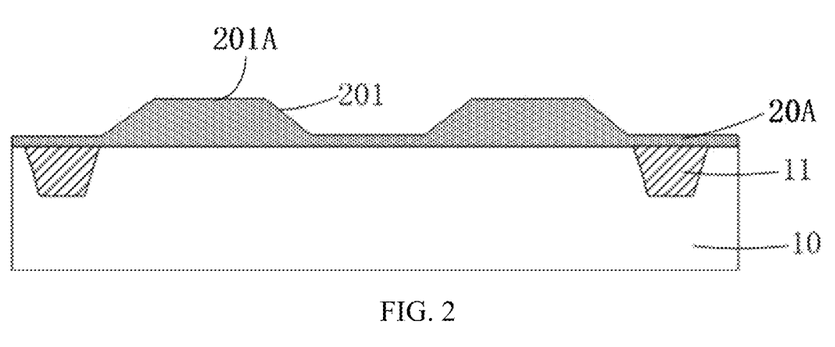

Returning to FIG. 10, in S103, the oxide layer is etched to form a sloped sidewall. FIG. 2 illustrates a corresponding structure. As shown in FIG. 2, the oxide layer 20 is etched to form a sloped sidewall 201.

In some embodiments, etching the oxide layer 20 to form the sloped sidewall 201 includes an anisotropic dry etching. Process parameters of the dry etching include a mixed etching gas of octafluorocyclobutane ($C_4F_8$), carbon tetrafluoride ($CF_4$), and fluoroform ($CHF_3$), having a volume ratio of 2:1:3, and an etching pressure of 0.05 Torr-0.15 Torr.

The etching gas includes a gas with a high fluorocarbon ratio such as octafluorocyclobutane ($C_4F_8$), carbon tetrafluoride ($CF_4$), etc. The etching produces a by-product on the sidewall 201. The by-product covers the sidewall 201, which may protect the sidewall 201 and cause a slower etching rate when closer to the surface of the substrate 10 to thus form the sloped sidewall 201.

As shown in FIG. 2, after the sloped sidewall 201 is formed, the dry etching is stopped, and a remaining oxide layer is formed. The remaining oxide layer includes a plurality of initial first gate oxide layers 201A each with sloped sidewalls 201 and an oxide layer portion 20A between adjacent initial first gate oxide layers 201A. The oxide layer portion 20A has a certain thickness based on the substrate.

Due to a relatively high etching rate of dry etch, if the retained oxide layer portion 20A is not sufficient, the surface of substrate 10 may be easily damaged, which may be harmful to the performance of semiconductor devices.

Figure 3:
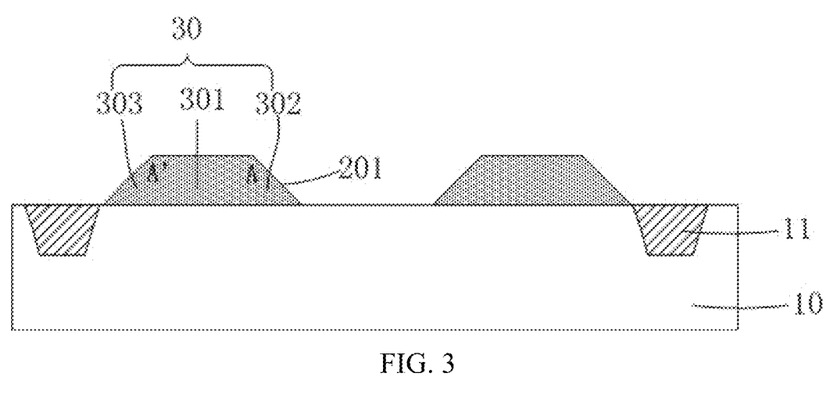

Returning to FIG. 10, in S104, a wet etching process is performed to remove the oxide layer portion over the substrate between the initial adjacent first gate oxide layers to form a plurality of first gate oxide layers having sloped sidewalls. FIG. 3 illustrates a corresponding structure.

As shown in FIG. 3, a wet etching process is performed to remove the oxide layer portion 20A over the substrate 10 between the initial adjacent first gate oxide layers 201A to form a plurality of first gate oxide layers 30 having sloped sidewalls 201.

In some embodiments, the first gate oxide layer 30 has a shape including a positive trapezoid. To facilitate subsequent description, the first gate oxide layer 30 is divided into a rectangular region 301 and sloped regions 302 and 303. Two corners A and A' are formed between the rectangular region 301 and the sloped regions 302 and 303, respectively.

An angle made between one of the sidewalls 201 of the first gate oxide layer 30 and the surface of the substrate 10 is 30° to 60°. If the angle is smaller than 30°, the thickness of the first gate oxide layer 30 changes slowly, which results in a large turn-on voltage of the semiconductor device and slow response speed. If the angle is larger than 60°, the thickness of the first gate oxide layer 30 decreases rapidly, such that the first gate oxide layer 30 is easily broken down.

In some embodiments, two of the first gate oxide layers 30 are formed at the same time. Two gate structures are formed based on the two first gate oxide layers 30 during subsequent processes, and a common source region between the two gate structures is formed. On one hand, process procedures may be reduced. On the other hand, sharing the source region may reduce the area needed by the device.

In some other embodiments, only one of the first gate oxide layers 30 or more than two of the first gate oxide layers 30 may be formed.

The two formed first gate oxide layers 30 are located over the substrate 10 between shallow trench isolation structures 11. A sloped region 303 of the first gate oxide layer 30 is near one of the shallow trench isolation structures 11, and a sloped region 302 of the first gate oxide layer 30 is far away from the one of the shallow trench isolation structures 11.

In some embodiments, process parameters of the wet etching include an etching solution of hydrofluoric acid (HF). The concentration of the hydrofluoric acid (HF) is 1:100.

Before the oxide layer 20 is dry-etched, a photoresist layer (not shown) needs to be formed over the oxide layer 20. The photoresist layer is etched to form a photoresist pattern, and the oxide layer 20 is etched using the photoresist pattern as a mask. After the oxide layer portion 20A is wet-etched to form the first gate oxide layers 30, the photoresist pattern is removed.

Figure 4:
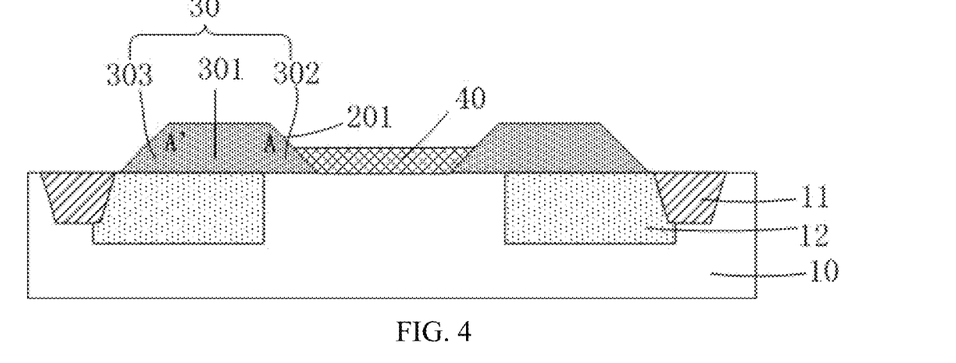

Returning to FIG. 10, in S105, after the first gate oxide layer is formed, a drift region is formed in the substrate. FIG. 4 illustrates a corresponding structure.

As shown in FIG. 4, after the first gate oxide layer 30 is formed, a drift region 12 is formed in the substrate 10. The drift region 12 is configured to reduce a voltage during the subsequent operation of the semiconductor device.

In some embodiments, one side of the drift region 12 is connected to the shallow trench isolation structure 11, and the other side does not exceed the corner A of the first gate oxide layer 30.

In some embodiments, the formed LDMOS includes an N-type LDMOS, the substrate 10 includes a P-type substrate, and the drift region 12 is doped with N-type impurity ions. The N-type impurity ions include one or more of phosphorus ions, arsenic ions, or antimony ions. In some other embodiments, when the formed LDMOS includes a P-type LDMOS, the substrate 10 includes an N-type substrate, and the drift region 12 is doped with P-type impurity ions. The P-type impurity ions include one or more of boron ions, indium ions, or gallium ions.

Returning to FIG. 10, in S106, a second gate oxide layer is formed between the adjacent first gate oxide layers, and the thickness of the second gate oxide layer is less than the thickness of the first gate oxide layer.

Returning to FIG. 4, a second gate oxide layer 40 is formed between the adjacent first gate oxide layers 30, and the thickness of the second gate oxide layer 40 is less than the thickness of the first gate oxide layer 30.

A ratio of the thicknesses of the first gate oxide layer 30 and the second gate oxide layer 40 ranges from 4:1 to 5:1.

The voltage value gradually decreases from the corner A of the first gate oxide layer 30 to the second gate oxide layer 40 during the subsequent operation of the semiconductor device. Therefore, the thickness of the second gate oxide layer 40 does not need to be too thick and is less than the thickness of the first gate oxide layer 30. As such, Ron of the semiconductor device can be reduced.

In some embodiments, forming the second oxide layer 40 includes a tube furnace thermal oxidation method. A material of the second oxide layer 40 includes silicon oxide.

Figure 5:
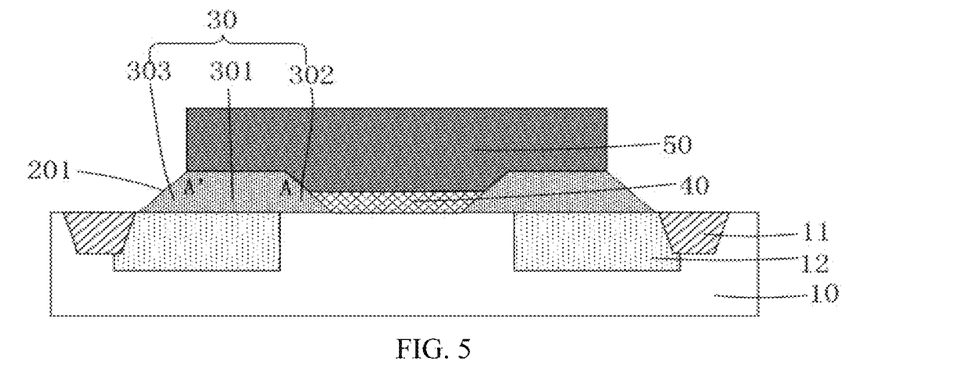

Returning to FIG. 10, in S107, a semiconductor layer, such as a silicon layer is formed over the first gate oxide layer and the second gate oxide layer and dry-etched to remove an undesirable part of the silicon layer. FIG. 5 illustrates a corresponding structure.

As shown in FIG. 5, a semiconductor layer, such as silicon layer 50 is formed over the first gate oxide layer 30 and the second gate oxide layer 40.

In some embodiments, forming the silicon layer 50 includes the CVD method.

In some embodiments, the silicon layer 50 covers all or a part of the rectangular region 301 and the sloped region 302 of the first gate oxide layer 30 and the second gate oxide layer 40.

In the embodiment, forming the silicon layer 50 further includes forming a mask layer (not shown) over the silicon layer 50, using the mask layer as a mask to etch the silicon layer 50, and removing the silicon layer 50 over the sloped region 303 or over the sloped region 303 and a part of the rectangular region 301.

As such, the silicon layer 50 is configured for subsequent formation of the gate structure, and the silicon layer 50 over the sloped region 303 is removed to reserve space for subsequent formation of a drain region between the gate structure and the shallow trench isolation structure.

In some embodiments, etching the silicon layer 50 includes the dry etching.

Figure 6:
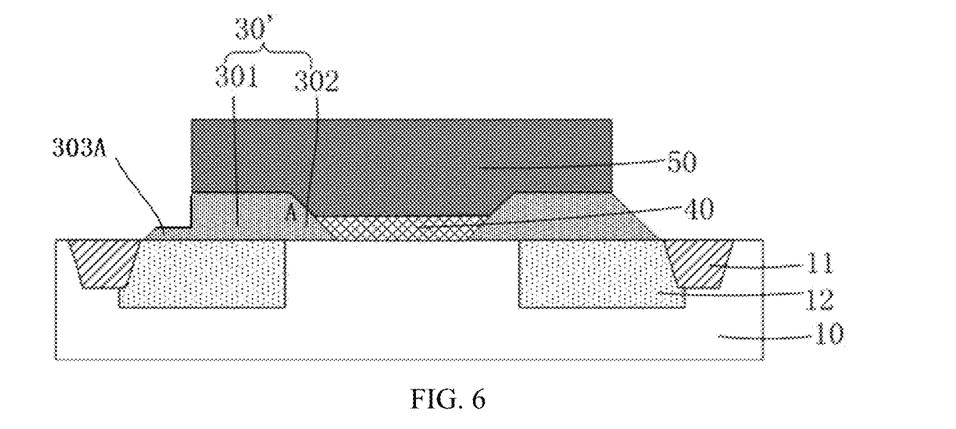
Figure 7:
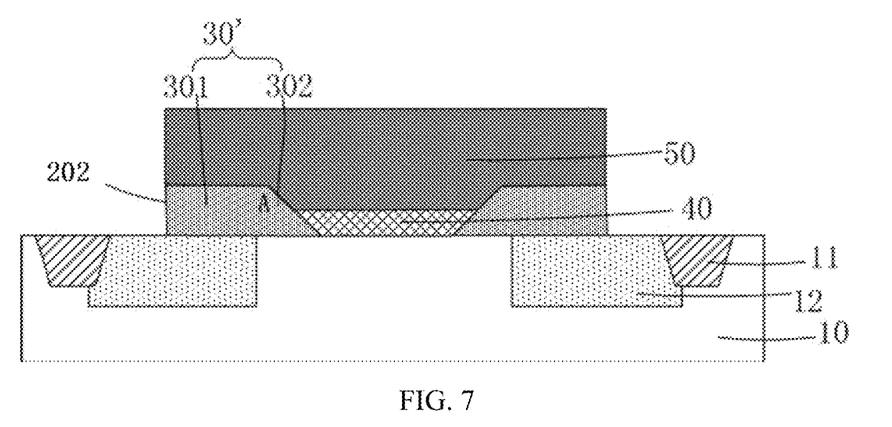

Returning to FIG. 10, in S108, the first gate oxide layer is etched to remove the sloped region of the first gate oxide layer adjacent to the shallow trench isolation structure. FIG. 6 and FIG. 7 illustrate corresponding structures.

As shown in FIG. 6 and FIG. 7, the first gate oxide layer 30 is etched to remove the sloped region 303 of the first gate oxide layer 30 adjacent to the shallow trench isolation structure 11.

As such, the space for the subsequent formation of the drain region is reserved, and the subsequently formed drain region is between the shallow trench isolation structure 11 and the subsequently formed gate structure. Therefore, when electrons are transmitted from the drain region to a subsequently formed source region, the electrons do not need to bypass the shallow trench isolation structure. As such, an electron migration path is short, the Ron of the semiconductor is reduced, and the response speed is improved.

In some embodiments, etching the first gate oxide layer 30 includes dry-etching the sloped region 303 to form a vertical sidewall 202, and stopping the dry etching when a dry-etched first gate oxide layer 303A having a thickness is formed over the substrate 10.

When the dry-etched first gate oxide layer 303A is formed over the substrate 10, the dry etching is stopped. As such, a too fast dry etching rate can be avoided from damaging the substrate 10, and the subsequent processes can be facilitated.

In some embodiments, the process parameters of the dry etching include a mixed etching gas of carbon tetrafluoride ($CF_4$), and fluoroform ($CHF_3$), where a volume ratio is 1:1-1:2, and an etching pressure of 0.05-0.15 Torr.

After the dry etching process, a wet etching process is performed to remove the dry-etched first gate oxide layer 303A to form a first gate oxide layer 30'. The first gate oxide layer 30' includes a sloped sidewall 201 away from the shallow trench structure 11, and a vertical sidewall 202 adjacent to the shallow trench isolation structure 11. The vertical sidewall 202 is aligned with a sidewall of the silicon layer 50 in a vertical direction.

In some embodiments, process parameters of the wet etching include the etching solution of a hydrofluoric acid (HF). The concentration of the hydrofluoric acid (HF) is 1:100.

Returning to FIG. 10, S109, the silicon layer is etched to expose the second gate oxide layer. FIG. 8 illustrates a corresponding structure.

As shown in FIG. 8, the silicon layer 50 is etched to expose the second gate oxide layer 40. In some embodiments, the silicon layer 50 between the adjacent first gate oxide layers 30' is etched.

In some embodiments, etching the silicon layer 50 includes dry etching. Etching gases of the dry etching include hydrogen bromide (HBr) and chlorine gas ($Cl_2$).

Returning to FIG. 10, in S110, the second gate oxide layer is etched to expose the substrate to form a gate structure. FIG. 9 illustrates a corresponding structure.

As shown in FIG. 9, the second gate oxide layer 40 is etched to expose the substrate 10 to form a gate structure 60.

In some embodiments, etching the second gate oxide layer 40 includes dry etching. An etching gas of the dry etching includes hydrogen bromide (HBr) and helium (He).

When the second gate oxide layer 40 is etched, the etching gas is replaced with hydrogen bromide (HBr) and helium (He) so as to reduce the etching rate to avoid damaging the substrate 10 from too high an etching rate.

Returning to FIG. 10, in S111, after the gate structure is formed, a source region and a drain region are formed in the substrate on both sides of the gate structure. FIG. 9 illustrates a corresponding structure.

Returning to FIG. 9, after the gate structure 60 is formed, a source region 101 and a drain region 102 are formed in the substrate 10 on both sides of the gate structure 60. A source region 101 is disposed between two adjacent gate structures 60 and adjacent to sloped sidewalls of two adjacent first gate oxide layers 30'. The two adjacent gate structures 60 share one source region 101, which can reduce an area taken by the source region 101 and benefit integration of the semiconductor device. The drain region 102 is disposed in the drift region 12 and between the shallow trench isolation structure 11 and the gate structure 60, which is adjacent to the vertical sidewall 202 of the first gate oxide layer 30'.

After the source region 101 and the drain region 102 are formed, electrodes are drawn in the source region 101 and the drain region 102 to form a source and a drain.

For the semiconductor device formed by using the above-described method of some embodiments of the present disclosure, when a forward voltage is applied between the gate and the source, an inversion layer (not shown) is formed over the substrate 10 close to the gate structure 60. In some embodiments, the inversion layer is over the substrate 10 from under the sloped region 302 to the second gate oxide layer 40. Therefore, the thickness of the first gate oxide layer 30' decreases gradually in the sloped region 302, which may cause the semiconductor device to turn on easily and improve the response speed. During the operation of the semiconductor device, the electric field strength gradually decreases from the nearby region of the drain region 102 to the source region 101, and the voltage is reduced by the drift region. Therefore, the surface electric field is the largest near the drain region 102, where the gate oxide layer is most likely to be broken down. Thus, a thicker gate oxide layer needs to be provided. However, on the opposite, the thicker the gate oxide layer is, the larger the Ron is. Therefore, the gate oxide layer adjacent to the source region 101 does not need to be too thick. To maintain a low Ron, the thickness of the gate oxide layer may be gradually decreased. Therefore, the first gate oxide layer 30' having the sloped sidewall is formed by the method of the present disclosure. The thickness gradually decreases from the corner A to the sloped sidewall. The thickness of the formed second gate oxide layer 40 is much less than the thickness of the first gate oxide layer 30. An extra shallow trench isolation structure is not needed between the source and the drain. As such, the semiconductor device may have a higher voltage resistance, and a smaller Ron may be maintained.

In some embodiments, no shallow trench isolation structure 11 is formed between the formed source region 101 and the drain region 102, and the electrons may be directly transmitted from the drain to the source. The transmission path is short, which may further reduce Ron and improve the response speed of the semiconductor device.

The present disclosure also provides a semiconductor device formed by the above-described method.

As shown in FIG. 9, the semiconductor device includes a substrate 10, a gate structure 60 located over the substrate 10. The gate structure 60 includes a first gate oxide layer 30', a second gate oxide layer 40, and a silicon layer 50. The first gate oxide layer 30' is located over the substrate 10. The first gate oxide layer 30' includes a sloped sidewall and a vertical sidewall. The second gate oxide layer 40 is located over the substrate 10 on the sloped sidewall of the first gate oxide layer 30'. and the thickness of the second gate oxide layer 40 is less than the thickness of the first gate oxide layer 30'. The silicon layer 50 is located over the first gate oxide layer 30' and the second gate oxide layer 40.

A thickness ratio of the first gate oxide layer 30' and the second gate oxide layer 40 ranges from 4:1 to 5:1.

In some embodiments, the substrate 10 further includes a shallow trench isolation structure 11 and a drift region 12. The drift region 12 is located on one side of the shallow trench isolation structure 11.

In some embodiments, the semiconductor device further includes a source region 101 and a drain region 102. The source region 101 and the drain region 102 are located in the substrate 10 and on both sides of the gate structure 60, respectively.

In some embodiments, the source region 101 is located between the adjacent gate structures 60 and is adjacent to the sloped sidewall of the first gate oxide layer 30'. The adjacent gate structures share a source, which can improve the integration of the semiconductor device. The drain region 102 is located in the drift region 12 and adjacent to the vertical sidewall 202 of the first gate oxide layer 30'.

During the subsequent operation of the semiconductor device, a surface electric field is the largest close to the drain region 102 and gradually decreases from the drain region 102 to the source region 101, and the voltage is reduced through the drift region 12. The thickness of the second gate oxide layer 40 is much less than the thickness of the first gate oxide layer 30'. At one aspect, no extra isolation structure is needed between the drain region 102 and the source region 101. Thus, electrons can flow directly from the drain region 102 to the source region 101 and do not need to bypass the isolation structure. As such, the electron transmission path is reduced to reduce Ron, and the response speed of the semiconductor device is improved. At another aspect, the thickness of the first gate oxide layer 30' is larger where the voltage is higher, the first gate oxide layer 30' includes a sloped-shaped region where the voltage is low. Then, the second gate oxide layer 40 is provided, such that the thickness decreases gradually. As such, BVdss of the semiconductor device is increased, and the response speed of the semiconductor device is also improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor device, comprising:
    providing a substrate;
    forming an oxide layer over the substrate;
    forming a plurality of first gate oxide layers by etching the oxide layer, wherein the first gate oxide layer of the plurality of first gate oxide layers has sloped sidewalls;
    forming a second gate oxide layer between adjacent first gate oxide layers, wherein a thickness of the second gate oxide layer is less than a thickness of the first gate oxide layer;
    forming a silicon layer over the plurality of first gate oxide layers and the second gate oxide layer; and
    etching the plurality of first gate oxide layers, the silicon layer, and the second gate oxide layer to expose the substrate, thereby forming a plurality of gate structures, wherein each gate structure includes an etched first oxide layer, a portion of the second gate oxide layer, and a portion of the silicon layer formed on the etched first oxide layer and the portion of the second gate oxide layer.

2. The method of claim 1, wherein forming the plurality of first gate oxide layers includes:
    etching the oxide layer using a dry etching process, such that a remaining oxide layer includes:
        initial first gate oxide layers each with sloped sidewalls, and
        an oxide layer portion between adjacent initial first gate oxide layers and having a thickness based on the substrate; and
    removing the oxide layer portion of the remaining oxide layer from the substrate using a wet etching process to form the plurality of first gate oxide layers.

3. The method of claim 2, wherein an etching gas of the dry etching includes octafluorocyclobutane ($C_4F_8$), carbon tetrafluoride ($CF_4$), and fluoroform ($CHF_3$), having a volume ratio of 2:1:3, correspondingly.

4. The method of claim 1, wherein an angle made between a sloped sidewall of the first gate oxide layer and the substrate is 30° to 60°.

5. The method of claim 1, wherein forming the oxide layer includes a chemical vapor deposition (CVD) method.

6. The method of claim 1, wherein etching the plurality of first gate oxide layers, the silicon layer, and the second gate oxide layer includes:
    etching the plurality of first gate oxide layers, including:

dry-etching one of the sloped sidewalls of each first gate oxide layer to form a vertical sidewall on a portion of the dry-etched first gate oxide layer over the substrate, wherein the portion of the dry-etched first gate oxide layer has a thickness over the substrate; and wet-etching to remove the portion of the dry-etched first gate oxide layer having the thickness from the substrate, wherein another sloped sidewall of the sloped sidewalls of each first gate oxide layer remains over the substrate.

7. The method of claim 6, wherein an etching gas used in the dry-etching includes carbon tetrafluoride ($CF_4$) and fluoroform ($CHF_3$).

8. The method of claim 6, wherein an etching solution used in the wet-etching includes an HF solution.

9. The method of claim 1, wherein etching the plurality of first gate oxide layers, the silicon layer, and the second gate oxide layer includes:

etching the silicon layer and the second gate oxide layer, including:

etching the silicon layer to expose the second gate oxide layer by using a dry etching process; and etching the second gate oxide layer to expose the substrate by using a dry etching process.

10. The method of claim 9, wherein an etching gas used in the dry etching of the silicon layer includes hydrogen bromide (HBr) and chlorine gas ($Cl_2$).

11. The method of claim 9, wherein an etching gas used in the dry etching of the second gate oxide layer includes hydrogen bromide (HBr) and Helium gas (He).

12. The method of claim 1, wherein the etched first gate oxide layer in each gate structure has a sloped sidewall on one side and a vertical sidewall on another side.

13. The method of claim 12, after forming the plurality of gate structures, further comprising:

forming a source region and a drain region in the substrate on both sides of each gate structure, wherein:

the source region is formed adjacent to one of the sloped sidewalls of the first gate oxide layer; and the drain region is formed adjacent to the vertical sidewall of the etched first gate oxide layer.

\* \* \* \* \*